(12) United States Patent
Chao et al.

(10) Patent No.: US 9,069,027 B2
(45) Date of Patent: Jun. 30, 2015

(54) CELL VOLTAGE MONITORING AND SELF-CALIBRATING DEVICE

(75) Inventors: Po Yin Chao, Taipei (TW); Chuan Sheng Wang, Taipei (TW); Hung Wei Chen, Taipei (TW)

(73) Assignee: Hycon Technology Corp., Taipei (TW)

( * ) Notice: Subject to any disclaimer, the term of this patent is extended or adjusted under 35 U.S.C. 154(b) by 496 days.

(21) Appl. No.: 13/550,724

(22) Filed: Jul. 17, 2012

(65) Prior Publication Data

US 2014/0025323 A1   Jan. 23, 2014

(51) Int. Cl.
  *G01R 35/00* (2006.01)
  *G06F 19/00* (2011.01)
  *G01R 31/36* (2006.01)

(52) U.S. Cl.
  CPC .......... *G01R 35/005* (2013.01); *G01R 31/3658* (2013.01)

(58) Field of Classification Search
  CPC .......................... G01R 35/005; G01R 31/3658
  USPC ......... 702/63; 324/434, 426, 76.11, 429, 679; 320/116.118, 136
  See application file for complete search history.

(56) References Cited

U.S. PATENT DOCUMENTS

| | | | |
|---|---|---|---|
| 7,638,979 B2 * | 12/2009 | Vandensande | 320/136 |
| 8,515,699 B2 * | 8/2013 | Gorbold et al. | 702/63 |
| 8,638,065 B2 * | 1/2014 | Sakakibara | 320/118 |
| 2001/0026161 A1 * | 10/2001 | Furukawa | 324/679 |
| 2003/0030442 A1 * | 2/2003 | Sugimoto | 324/429 |
| 2004/0178768 A1 * | 9/2004 | Miyazaki et al. | 320/116 |
| 2007/0170889 A1 * | 7/2007 | Ishikawa et al. | 320/116 |
| 2008/0012570 A1 * | 1/2008 | Bucur | 324/426 |
| 2008/0180106 A1 * | 7/2008 | Gorbold | 324/434 |
| 2008/0246533 A1 * | 10/2008 | Barrows et al. | 327/534 |
| 2010/0060256 A1 * | 3/2010 | Ishikawa et al. | 324/76.11 |
| 2010/0283473 A1 * | 11/2010 | Vandensande | 324/434 |
| 2011/0004427 A1 * | 1/2011 | Gorbold et al. | 702/63 |
| 2013/0002259 A1 * | 1/2013 | Cheng et al. | 324/426 |

FOREIGN PATENT DOCUMENTS

EP    1806592 A1    7/2007

OTHER PUBLICATIONS

Corresponding extended European search report dated Jan. 4, 2013.

* cited by examiner

*Primary Examiner* — Carol S Tsai
(74) *Attorney, Agent, or Firm* — Che-Yang Chen; Law Office of Michael Chen

(57) ABSTRACT

A cell voltage monitoring and self-calibrating device for a plurality of battery cells connected in series is disclosed. The device includes a first voltage measurement unit, a second voltage measurement unit, a first compensation unit, a second compensation unit and a calculating unit. It can measure voltages of each cell in a battery pack which provides power to electric equipment and calibrates itself during measurement.

20 Claims, 4 Drawing Sheets

CELL VOLTAGE MONITORING AND SELF-CALIBRATING DEVICE

FIELD OF THE INVENTION

The present invention relates to a cell voltage monitoring and self-calibrating device. More particularly, the present invention relates to a cell voltage monitoring and self-calibrating device for a plurality of battery cells connected in series. The present invention can be applied to measure voltage of each battery in a battery pack for battery driven equipment, such as electric vehicles, electric tools and so on.

BACKGROUND OF THE INVENTION

Rechargeable battery is a group of one or more electrochemical cells. They are known as secondary cells because their electrochemical reactions are electrically reversible. Among all kinds of rechargeable batteries, lithium-ion battery (Li-ion battery or LIB) is the most commonly used one. It can be applied to many electric products, such as electric vehicles, electric motorcycles, electric tools, toys and so on. Stable power supply, compact size and recharging ability are the advantages for all applications.

Power management of lithium-ion batteries needs a very accurate voltage measuring circuit. No matter electric vehicles, electric motorcycles, electric tools, or toys, the application of lithium-ion batteries requires many lithium-ion batteries connected in series. Usually, an analog to digital converter for high voltage or several individual analog to digital converters are necessary components. However, each analog to digital converter has different characteristics from others. Namely, measurement of each analog to digital converter will be different from others. The analog to digital converters have to be calibrated before measuring processes begin. It is better if an analog to digital converter can be able to calibrate itself when it is working. In addition, cost for calibration of analog to digital converters is expensive. Power management of lithium-ion batteries still needs improvements.

In order to overcome the disadvantages, U.S. Pat. No. 7,554,291 disclosed a chargeable-and-dischargeable power supply system. Please refer to FIG. 1. The system includes a number of battery cell sections connected in series with one another; a number of cell state detecting sections installed for the respective battery cell sections and configured to detect a charge state in the respectively corresponding battery cell sections; a power control section configured to carry out a power supply control for the battery cell sections; a first electrical isolation section installed in a first signal route from the power control section to one of the cell state detecting sections which is for a highest potential positioned battery cell section; and a second electrical isolation section installed in a second signal route from one of the cell state detecting sections which is for a lowest potential positioned battery cell section to the power control section.

Next, please refer to FIG. 2. Another prior art is disclosed in US Patent Application No. 2006/0132139. An apparatus measures a voltage of a cell while scanning a group of cells in a cell stack, in which a number of cells is electrically connected in series. The apparatus has a first switching device and a voltage detecting device. The first switching device is connected in series with a signal line carrying a voltage of a cell. The voltage detecting device detects the voltage of the cell, which is electrically connected with signal lines carrying voltages of cells belonging to a group. When the first switching device is electrically connected with a connecting point between two successive groups of cells, the first switching device is shared by the two groups.

The aforementioned prior arts show some breakthroughs in cell voltage detection. However, they need external components and integrated circuits for voltage transformation. This brings additional cost. Meanwhile, self-calibration is not available. Although calibration problems can be solved by use of a calibrator connected to each battery cells, multiple calibrators will be needed for a battery pack which contains multiple battery cells which would undoubtedly increase the overall manufacturing cost. Furthermore, if a single calibrator is used for calibration of multiple battery cells, the overall voltage needed for the calibrator would be very high such that the manufacturing cost would increase magnificently. Hence, it is desperately needed for a cell voltage monitoring device which has the ability of self-calibration and which does not need to depend on multiple calibrators, and thereby reducing the overall manufacturing cost.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a cell voltage monitoring and self-calibrating device for a plurality of battery cells connected in series includes a first voltage measurement unit, for measuring voltages of a first battery cell and a second battery cell; a second voltage measurement unit, for measuring voltages of a second battery cell and a third battery cell; a first compensation unit, connected to the first voltage measurement unit, for adjusting the voltages of the first and second battery cells by multiplying the measured voltages of the first and second battery cells by a first compensation value; a second compensation unit, connected to the second voltage measurement unit, for adjusting the voltages of the second and third battery cells by multiplying the measured voltages of the second and third battery cells by a second compensation value; and a calculating unit, connected to the first voltage measurement unit, the second voltage measurement unit, the first compensation unit and the second compensation unit, for calculating the first compensation value and the second compensation value based on the voltages of the second battery cell measured by the first voltage measurement unit and the second voltage measurement unit such that the voltages of the second battery cell will be the same after being adjusted by the first compensation unit and the second compensation unit.

Preferably, the first, second and third battery cells are connected in series sequentially.

Preferably, the first compensation value is set to one.

Preferably, the second compensation value is set to one.

Preferably, the cell voltage monitoring and self-calibrating device further includes a voltage reference unit for providing a standard voltage level to the calculating unit.

Preferably, the standard voltage level is an actual voltage of the plurality of battery cells connected in series or an actual voltage of one of the battery cells.

Preferably, the calculating unit calculates a third compensation value by dividing the standard voltage level by the corresponding adjusted voltage.

Preferably, the voltages of the first and second battery cells are adjusted by multiplying the measured voltages of the first and second battery cells by the first compensation value and the third compensation value, and the voltage of the third battery cell is adjusted by multiplying the measured voltage of the third battery cell by the second compensation value and the third compensation value, thereby self-calibration is achieved.

Preferably, the cell voltage monitoring and self-calibrating device further includes a first multiplexer for receiving voltages of the first battery cell and the second battery cell interactively, and outputting the voltages in sequence to the first voltage measurement unit; and a second multiplexer for receiving voltages of the second battery cell and the third battery cell interactively, and outputting the voltages in sequence to the second voltage measurement unit.

Preferably, the voltage of the second battery cell measured by the first voltage measurement unit multiplied by the first compensation value is equal to the voltage of the second battery cell measured by the second voltage measurement unit multiplied by the second compensation value.

Preferably, the battery cell is a rechargeable battery.

Preferably, the rechargeable battery is a lithium-ion battery.

Preferably, the first voltage measurement unit measures voltages of more than two battery cells at the same time.

Preferably, the second voltage measurement unit measures voltages of more than two battery cells at the same time.

In accordance with another aspect of the present invention, a cell voltage monitoring and self-calibrating device includes: at least two voltage measurement units, for measuring voltages of a plurality of battery cells, wherein at least one of the battery cells is measured by two of the voltage measurement units; at least two compensation units, each connected to one of the voltage measurement units, for adjusting the voltages of the battery cells by multiplying the measured voltages of the battery cells by a first compensation value; a calculating unit, connected to the voltage measurement units and the compensation units, for calculating the first compensation value based on the voltages of the battery cell which is measured by the two voltage measurement units such that the voltages of the battery cell will be the same after being adjusted by the two compensation units, thereby systematic measurement errors of each battery cells can be combined into a single variable for self-calibration.

Preferably, the cell voltage monitoring and self-calibrating device further includes a voltage reference unit for providing a standard voltage level to the calculating unit.

Preferably, the standard voltage level is an actual voltage of the plurality of battery cells connected in series or an actual voltage of one of the battery cells.

Preferably, the calculating unit calculates a second compensation value by dividing the standard voltage level by the corresponding adjusted voltage.

Preferably, the voltages of the battery cells are adjusted by multiplying the measured voltages of the battery cells by the first compensation value and the second compensation value, thereby self-calibration is achieved.

Preferably, the cell voltage monitoring and self-calibrating device further includes at least one multiplexer for receiving voltages of the battery cells and outputting the voltages in sequence to the voltage measurement units.

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illumination and description only; it is not intended to be exhaustive or to be limited to the precise form disclosed.

In order to have a comprehensive understanding of the present invention, two embodiments are described below in details.

First Embodiment

Figure 1:
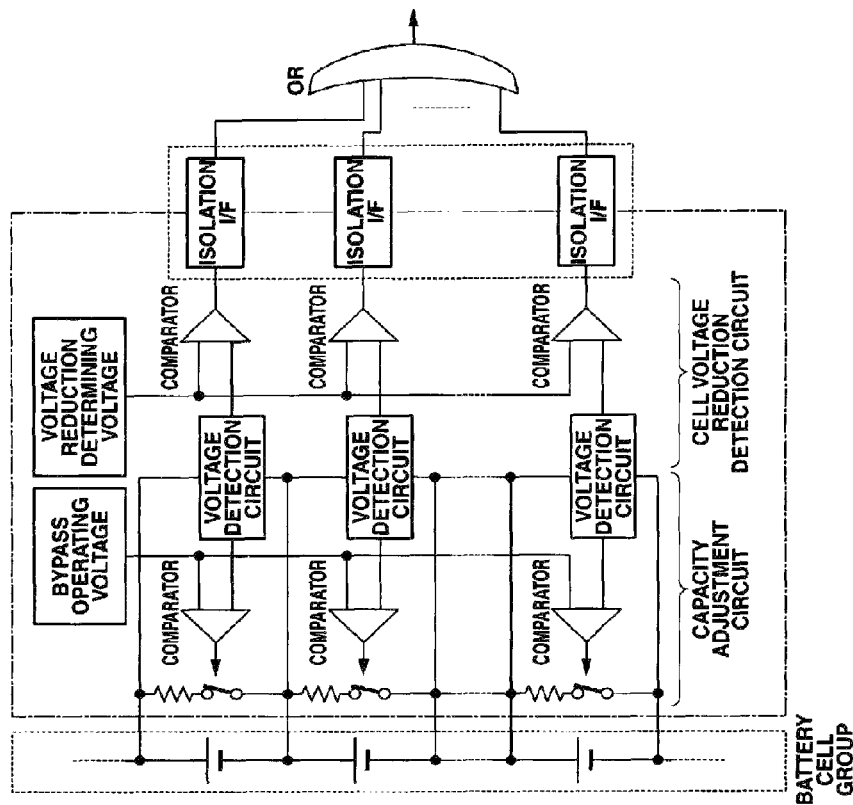
FIG. 1 shows a prior art of a chargeable-and-dischargeable power supply system.
Figure 1:
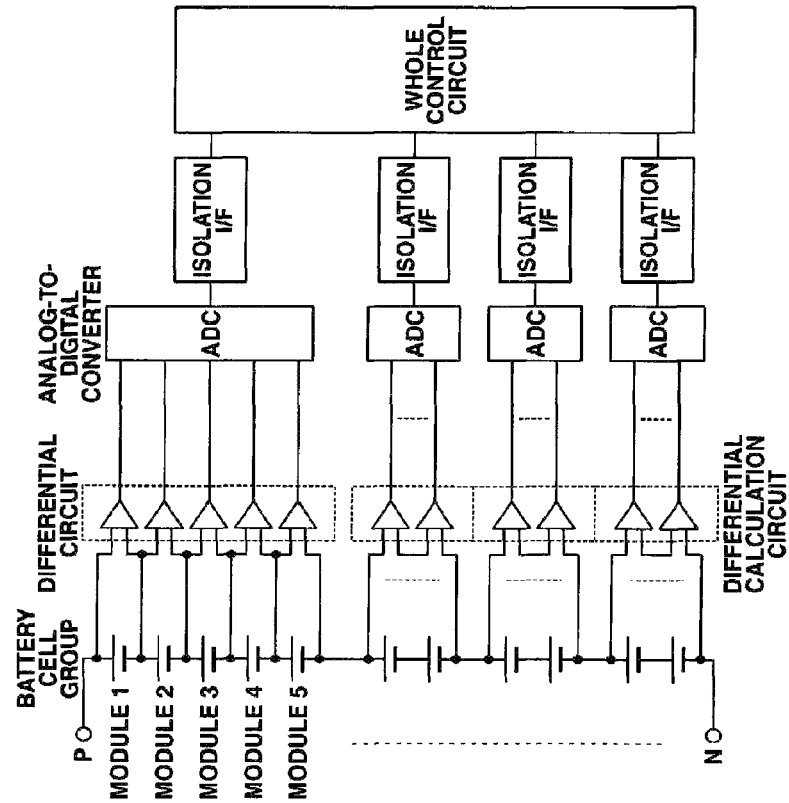
Figure 2:
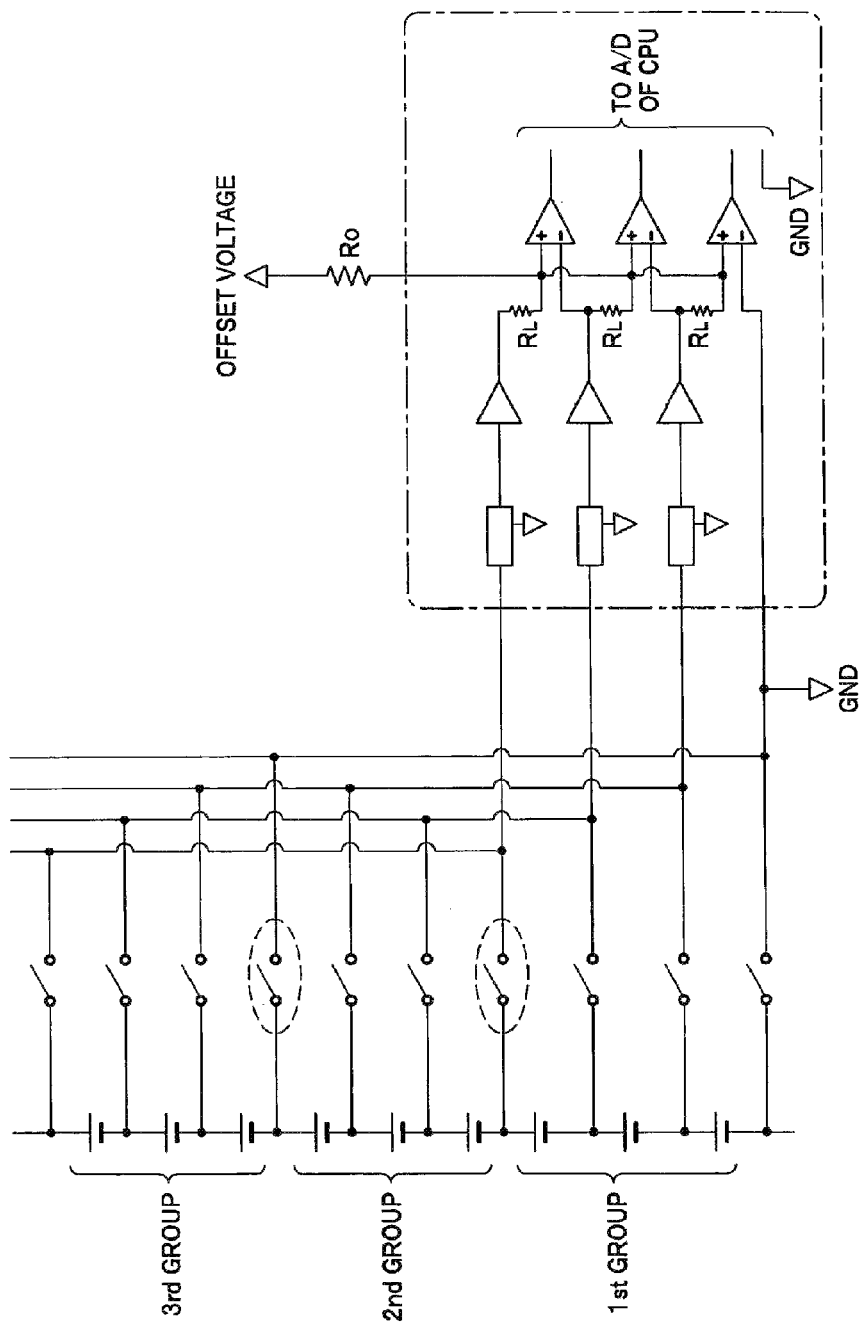
FIG. 2 shows a prior art of an apparatus measuring a voltage of a cell.
Figure 3:
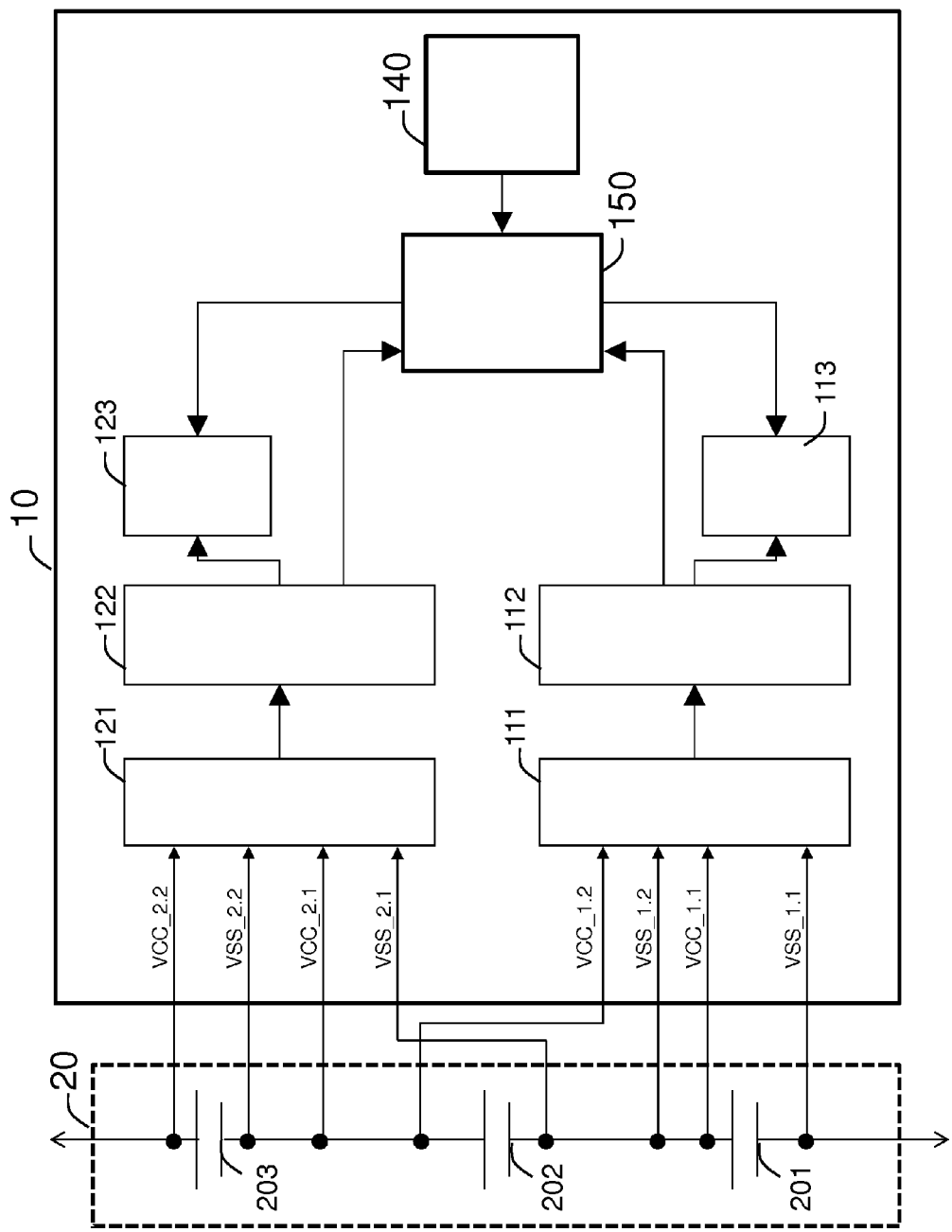
FIG. 3 illustrates a first embodiment of the present invention.

Please refer to FIG. 3. A first embodiment is illustrated. Please refer to FIG. 3. It shows a layout of a cell voltage monitoring device 10. The cell voltage monitoring device 10 is able to self-calibrate and be applied to a number of battery cells connected in series. In this embodiment, the cell voltage monitoring device 10 is linked to a battery pack 20, having a first battery cell 201, a second battery cell 202 and a third battery cell 203 connected in series sequentially as shown in FIG. 3. All the battery cells mentioned above are rechargeable batteries. Preferably, they are lithium-ion batteries in practice.

The cell voltage monitoring device 10 includes a first multiplexer 111, a first voltage measurement unit 112, a first compensation unit 113, a second multiplexer 121, a second voltage measurement unit 122, a second compensation unit 123, and a calculating unit 150.

First, the first multiplexer 111 receives voltages of the first battery cell 201 and the second battery cell 202 interactively, and outputs the voltages in sequence to the first voltage measurement unit 112. Meanwhile, the second multiplexer 121 receives voltages of the second battery cell 202 and the third battery cell 203 interactively, and outputs the voltages in sequence to the second voltage measurement unit 122.

After the first voltage measurement unit 112 receives the voltages from the first multiplexer 111 via channels VSS_1.1, VCC_1.1, VSS_1.2 and VCC_1.2, the first voltage measurement unit 112 measures voltages of the first battery cell 201 and the second battery cell 202. The measured voltage of the first battery cell 201 is $V_{1\_1}$ and the measured voltage of the second battery cell 202 is $V_{2\_1}$. Similarly, after the second voltage measurement unit 122 receives the voltages from the second multiplexer 121 via channels VSS_2.1, VCC_2.1, VSS_2.2 and VCC_2.2, the second voltage measurement unit 122 measures voltages of the second battery cell 202 and the third battery cell 203. The measured voltage of the second battery cell 202 is $V_{2\_2}$ and the measured voltage of the third battery cell 203 is $V_{3\_2}$.

A systematic measurement error may be caused during the operation of the first multiplexer 111, the first voltage measurement unit 112, the second multiplexer 121 or the second voltage measurement unit 122. Traditionally, such problem is solved by use of a calibrator. However, for a battery pack which contains multiple battery cells, multiple calibrators are needed, one for each of the battery cell, which would undoubtedly increase the overall manufacturing cost. Hence, the main characteristic of the present invention is to provide a cell voltage monitoring device which has the ability of self-calibration which does not need to depend on multiple calibrators, thereby reducing the overall manufacturing cost.

To achieve such goal, the first compensation unit 113 and the second compensation unit 123 are used to adjust the voltages of the battery cells 201, 202 and 203 by providing voltage gains.

The first compensation unit 113 is connected to the first voltage measurement unit 112 for adjusting the voltages of the first battery cell 201 and the second battery cell 202. The voltages are adjusted by multiplying the measured voltages of the first battery cell 201 and the second battery cell 202 by a first compensation value $C_1$. The voltage of the first battery cell 201 is adjusted from $V_{1\_1}$ to $V_{1\_1A}$ which is equal to $V_{1\_1} \times C_1$. The voltage of the second battery cell 201 is adjusted from $V_{2\_1}$ to $V_{2\_1A}$ which is equal to $V_{2\_1} \times C_1$.

Similarly, the second compensation unit 123 is connected to the second voltage measurement unit 122 for adjusting the voltages of the second battery cell 202 and the third battery cell 203. The voltages are adjusted by multiplying the measured voltages of the second battery cell 202 and the third battery cell 203 by a second compensation value $C_2$. The voltage of the second battery cell 202 is adjusted from $V_{2\_2}$ to $V_{2\_2A}$ which is equal to $V_{2\_2} \times C_2$. The voltage of the third battery cell 203 is adjusted from $V_{3\_2}$ to $V_{3\_2A}$ which is equal to $V_{3\_2} \times C_2$.

The calculating unit 150 is connected to the first voltage measurement unit 112, the second voltage measurement unit 122, the first compensation unit 113 and the second compensation unit 123. The calculating unit 150 is used for calculating the first compensation value $C_1$ and the second compensation value $C_2$ based on the voltages ($V_{2\_1}$ and $V_{2\_2}$) of the second battery cell 202 measured by the first voltage measurement unit 112 and the second voltage measurement unit 122 such that the voltages of the second battery cell 202 will be the same after being adjusted by the first compensation unit 113 and the second compensation unit 123. Meaning that, the adjusted voltages ($V_{2\_1A}$ and $V_{2\_2A}$) of the second battery cell 202 will be the same. In other words, the voltage ($V_{2\_1}$) of the second battery cell 202 measured by the first voltage measurement unit 112 multiplied by the first compensation value $C_1$ is equal to the voltage ($V_{2\_2}$) of the second battery cell measured by the second voltage measurement unit 122 multiplied by the second compensation value $C_2$. Next, select the first compensation value $C_1$ or the second compensation value $C_2$ to be set to 1. In this embodiment, the first compensation value $C_1$ is set to 1, so $C_2 = V_{2\_1} \div V_{2\_2}$. In other conditions, the second compensation value $C_2$ can be set to 1 instead.

In order to obtain precise voltages of the battery cells 201, 202 and 203, the cell voltage monitoring device 10 further includes a voltage reference unit 140 for providing a standard voltage level $V_R$ to the calculating unit 150.

The standard voltage level $V_R$ is an actual voltage of the battery cells 201, 202 and 203 connected in series or an actual voltage of one of the battery cells 201, 202 and 203. For example, if the standard voltage level $V_R$ is an actual voltage of the first battery cell 201, then the calculating unit 150 will calculate a third compensation value $C_3$ by dividing the standard voltage level $V_R$ by the corresponding adjusted voltage of the first battery cell 201 which is $V_{1\_1A}$. Meaning that, $C_3 = V_R \div (V_{1\_1} \times C_1)$, and since $C_1$ is set to be 1, $C_3 = V_R \div V_{1\_1}$. After $C_3$ is calculated, voltages of the battery cells 201, 202 and 203 can be precisely adjusted by the first compensation unit 113 and the second compensation unit 123 by multiplying the measured voltages ($V_{1\_1}$ and $V_{2\_1}$) of the first battery cell 201 and the second battery cell 202 by the first compensation value $C_1$ and the third compensation value $C_3$, and multiplying the measured voltage ($V_{3\_2}$) of the third battery cell 203 by the second compensation value $C_2$ and the third compensation value $C_3$, thereby self-calibration can be achieved.

Although in this embodiment, the voltage reference unit 140 is included in the cell voltage monitoring device 10 for providing a standard voltage level $V_R$ to the calculating unit 150, an external voltage reference unit can also be used to provide such standard voltage level.

The main concept of the present invention is to have the first voltage measurement unit 112 and the second voltage measurement unit 122 measure the same battery cell whether or not such battery cell is placed between two other battery cells. Hence, the first battery cell 201, the second battery cell 202 and the third battery cell 203 are not limited to be connected in series sequentially as shown in FIG. 3. Instead, the first battery cell 201 can be placed between the second battery cell 202 and the third battery cell 203 while the second battery cell 202 is still being measured twice by both the first voltage measurement unit 112 and the second voltage measurement unit 122. In other words, although the first battery cell 201, the second battery cell 202 and the third battery cell 203 are connected in series sequentially in this embodiment, they are not limited to be placed in such sequence.

Traditionally, if a single calibrator is used for calibration of multiple battery cells, the overall voltage needed for the calibrator would be very high such that the manufacturing cost would increase magnificently. In this embodiment, each of the voltage measurement units just needs to measure two of the battery cells such that voltage needed for each voltage measurement unit is low; thereby manufacturing cost can be reduced. It should be understood that the voltage measurement unit is not limited to measure only two of the battery cells at a time, more than two battery cells can be measured at the same time according to the present invention. For example, the first voltage measurement unit 112 can be in charge of measuring four battery cells at the same time while the second voltage measurement unit 122 is in charge of measuring one of the four battery cells which is measured by the first voltage measurement unit 112 and another three battery cells which is not measured by the first voltage measurement unit 112.

By the present invention, systematic measurement errors of each battery cells can be combined into a single variable, and therefore, only one standard voltage level is needed for calibration. Hence, multiple voltage measurement units can be stacked together while amount of battery cells increases without increasing the amount of voltage reference units or calibrators.

Second Embodiment

The present invention is not limited to be used for measuring a battery pack with only three battery cells. It can also be used for battery packs which include more than three battery cells. Take a battery pack which includes four battery cells as an example.

Figure 4:
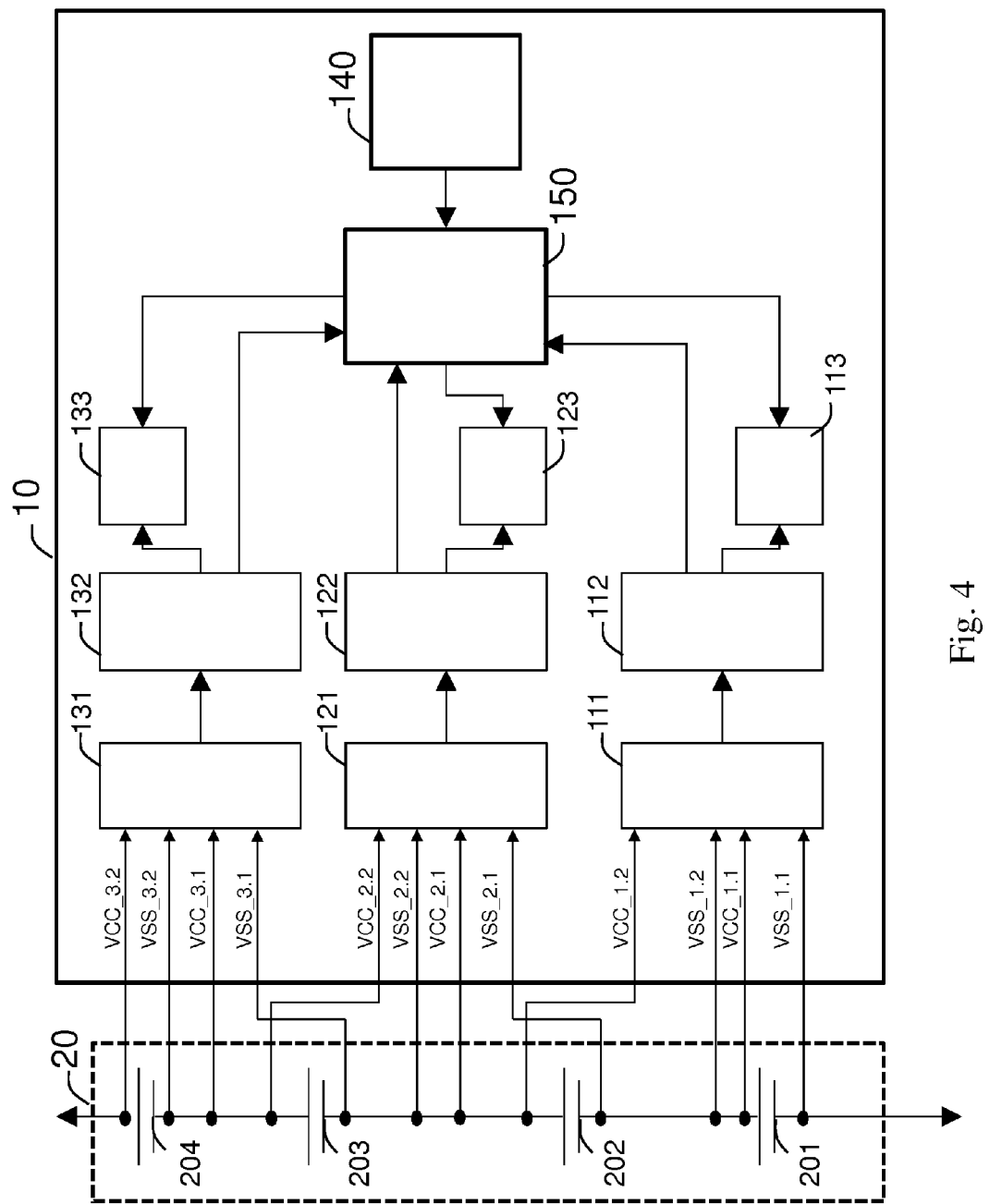
FIG. 4 illustrates a second embodiment of the present invention.

Please refer to FIG. 4. The second embodiment is disclosed. Members having like functions will be identified by like reference numerals and overlapping descriptions will be omitted.

The differences between the first embodiment and the second embodiment are that the battery pack 20 further includes a fourth battery cell 204, and the cell voltage monitoring device 10 further has a third multiplexer 131, a third voltage measurement unit 132 and a third compensation unit 133 in the second embodiment.

The third multiplexer 131 is connected to the third battery cell 203 and the fourth battery cell 204 in parallel, respectively, and receives voltages of the third battery cell 203 and the fourth battery cell 204 interactively, and outputs the voltages in sequence to the third voltage measurement unit 132.

After the third voltage measurement unit 132 receives the voltages from the third multiplexer 131 via channels VSS_3.1, VCC_3.1, VSS_3.2 and VCC_3.2, the third voltage measurement unit 132 measures voltages of the third battery cell 203 and the fourth battery cell 204. The measured voltage of the third battery cell 203 is $V_{3\_3}$ and the measured voltage of the fourth battery cell 204 is $V_{4\_3}$.

Like the cell voltage monitoring device 10 in the first embodiment, a systematic measurement error may be caused during operation of the third multiplexer 131 and the third voltage measurement unit 132.

To overcome such problem, the third compensation unit 133 is used to adjust the voltages of the battery cells 203 and 204 by providing voltage gains.

The third compensation unit 133 is connected to the third voltage measurement unit 132 for adjusting the voltages of the third battery cell 203 and the fourth battery cell 204. The voltages are adjusted by multiplying the measured voltages of the third battery cell 203 and the fourth battery cell 204 by a fourth compensation value $C_4$. The voltage of the third battery cell 203 is adjusted from $V_{3\_3}$ to $V_{3\_3A}$ which is equal to $V_{3\_3} \times C_4$. The voltage of the fourth battery cell 204 is adjusted from $V_{4\_3}$ to $V_{4\_3A}$ which is equal to $V_{4\_3} \times C_4$.

In this embodiment, the calculating unit 150 is connected to the first voltage measurement unit 112, the second voltage measurement unit 122, the third voltage measurement unit 132, the first compensation unit 113, the second compensation unit 123 and third compensation unit 133. The calculating unit 150 is not only used for calculating the first compensation value $C_1$, the second compensation value $C_2$ and the third compensation value $C_3$, but also for calculating the fourth compensation value $C_4$ based on the voltages ($V_{3\_2}$ and $V_{3\_3}$) of the third battery cell 203 measured by the second voltage measurement unit 122 and the third voltage measurement unit 132 such that the voltages of the third battery cell 203 will be the same after being adjusted by the second compensation unit 123 and the third compensation unit 133. Meaning that, the adjusted voltages ($V_{3\_2A}$ and $V_{3\_3A}$) of the third battery cell 203 will be the same. In other words, the voltage ($V_{3\_2}$) of the third battery cell 203 measured by the second voltage measurement unit 122 multiplied by the second compensation value $C_2$ is equal to the voltage ($V_{3\_3}$) of the third battery cell 203 measured by the third voltage measurement unit 132 multiplied by the fourth compensation value $C_4$. Next, select $C_1$, $C_2$ or $C_3$ to equal 1. In this embodiment, $C_1$ is selected, so $C_2 = V_{2\_1} \div V_{2\_2}$ and $C_4$ is calculated as below:

$$V_{3\_3} \times C_4 = V_{3\_2} \times C_2 = V_{3\_2} \times (V_{2\_1} \div V_{2\_2})$$

$$C_4 = [V_{3\_2} \times (V_{2\_1} \div V_{2\_2})] \div V_{3\_3}$$

As mentioned in the first embodiment, in order to obtain precise voltages of the battery cells, the cell voltage monitoring device 10 further includes a voltage reference unit 140 for providing a standard voltage level $V_R$ to the calculating unit 150. If the standard voltage level $V_R$ is an actual voltage of the first battery cell 201, then the calculating unit 150 will calculate a third compensation value $C_3$ by dividing the standard voltage level $V_R$ by the corresponding adjusted voltage of the first battery cell 201 which is $V_{1\_1A}$. Meaning that, $C_3 = V_R \div (V_{1\_1} \times C_1)$, and since $C_1$ is set to be 1, $C_3 = V_R \div V_{1\_1}$. After $C_3$ is calculated, voltages of the battery cells 201, 202 and 203 can be precisely adjusted as mentioned in the first embodiment, and voltage of the battery cell 204 can be precisely adjusted by multiplying the measured voltage ($V_{4\_3}$) of the fourth battery cell 204 by the third compensation value $C_3$ and the fourth compensation value $C_4$, thereby self-calibration can be achieved.

While the invention has been described in terms of what is presently considered to be the most practical and preferred embodiments, it is understood that the invention need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A cell voltage monitoring and self-calibrating device for a plurality of battery cells, comprising:
   a first voltage measurement unit, for measuring voltages of a first battery cell and a second battery cell;
   a second voltage measurement unit, for measuring voltages of a second battery cell and a third battery cell;
   a first compensation unit, connected to the first voltage measurement unit, for adjusting the voltages of the first and second battery cells by multiplying the measured voltages of the first and second battery cells by a first compensation value;
   a second compensation unit, connected to the second voltage measurement unit, for adjusting the voltages of the second and third battery cells by multiplying the measured voltages of the second and third battery cells by a second compensation value; and
   a calculating unit, connected to the first voltage measurement unit, the second voltage measurement unit, the first compensation unit and the second compensation unit, for calculating the first compensation value and the second compensation value based on the voltages of the second battery cell measured by the first voltage measurement unit and the second voltage measurement unit such that the voltages of the second battery cell will be the same after being adjusted by the first compensation unit and the second compensation unit, thereby systematic measurement errors of each battery cells can be combined into a single variable for self-calibration.

2. The cell voltage monitoring and self-calibrating device according to claim 1, wherein the first, second and third battery cells are connected in series sequentially.

3. The cell voltage monitoring and self-calibrating device according to claim 1, wherein the first compensation value is set to one.

4. The cell voltage monitoring and self-calibrating device according to claim 1, wherein the second compensation value is set to one.

5. The cell voltage monitoring and self-calibrating device according to claim 1, further comprising a voltage reference unit for providing a standard voltage level to the calculating unit.

6. The cell voltage monitoring and self-calibrating device according to claim 5, wherein the standard voltage level is an actual voltage of the plurality of battery cells connected in series or an actual voltage of one of the battery cells.

7. The cell voltage monitoring and self-calibrating device according to claim 6, wherein the calculating unit calculates a third compensation value by dividing the standard voltage level by the corresponding adjusted voltage.

8. The cell voltage monitoring and self-calibrating device according to claim 7, wherein the voltages of the first and second battery cells are adjusted by multiplying the measured voltages of the first and second battery cells by the first compensation value and the third compensation value, and the voltage of the third battery cell is adjusted by multiplying the measured voltage of the third battery cell by the second compensation value and the third compensation value, thereby self-calibration is achieved.

9. The cell voltage monitoring and self-calibrating device according to claim 1, further comprising a first multiplexer for receiving voltages of the first battery cell and the second battery cell interactively, and outputting the voltages in sequence to the first voltage measurement unit; and a second multiplexer for receiving voltages of the second battery cell and the third battery cell interactively, and outputting the voltages in sequence to the second voltage measurement unit.

10. The cell voltage monitoring and self-calibrating device according to claim 1, wherein the voltage of the second battery cell measured by the first voltage measurement unit multiplied by the first compensation value is equal to the voltage of the second battery cell measured by the second voltage measurement unit multiplied by the second compensation value.

11. The cell voltage monitoring and self-calibrating device according to claim 1, wherein the battery cell is a rechargeable battery.

12. The cell voltage monitoring and self-calibrating device according to claim 11, wherein the rechargeable battery is a lithium-ion battery.

13. The cell voltage monitoring and self-calibrating device according to claim 1, wherein the first voltage measurement unit measures voltages of more than two battery cells at the same time.

14. The cell voltage monitoring and self-calibrating device according to claim 1, wherein the second voltage measurement unit measures voltages of more than two battery cells at the same time.

15. A cell voltage monitoring and self-calibrating device, comprising:

at least two voltage measurement units, for measuring voltages of a plurality of battery cells, wherein at least one of the battery cells is measured by two of the voltage measurement units;

at least two compensation units, each connected to one of the voltage measurement units, for adjusting the voltages of the battery cells by multiplying the measured voltages of the battery cells by a first compensation value;

a calculating unit, connected to the voltage measurement units and the compensation units, for calculating the first compensation value based on the voltages of the battery cell which is measured by the two voltage measurement units such that the voltages of the battery cell will be the same after being adjusted by the two compensation units, thereby systematic measurement errors of each battery cells can be combined into a single variable for self-calibration.

16. The cell voltage monitoring and self-calibrating device according to claim 15, further comprising a voltage reference unit for providing a standard voltage level to the calculating unit.

17. The cell voltage monitoring and self-calibrating device according to claim 16, wherein the standard voltage level is an actual voltage of the plurality of battery cells connected in series or an actual voltage of one of the battery cells.

18. The cell voltage monitoring and self-calibrating device according to claim 17, wherein the calculating unit calculates a second compensation value by dividing the standard voltage level by the corresponding adjusted voltage.

19. The cell voltage monitoring and self-calibrating device according to claim 18, wherein the voltages of the battery cells are adjusted by multiplying the measured voltages of the battery cells by the first compensation value and the second compensation value, thereby self-calibration is achieved.

20. The cell voltage monitoring and self-calibrating device according to claim 15, further comprising at least one multiplexer for receiving voltages of the battery cells and outputting the voltages in sequence to the voltage measurement units.

\* \* \* \* \*